(12) United States Patent
Heinrich et al.

(10) Patent No.: US 9,010,884 B2
(45) Date of Patent: Apr. 21, 2015

(54) BACKING PIECE FOR ATTACHING AN ELECTRICAL COMPONENT TO A HOUSING WALL

(75) Inventors: Alexander Heinrich, Villingen-Schwenningen (DE); Matthias Wiedenmann, Neenstetten (DE)

(73) Assignee: BSH Bosch und Siemens Hausgeraete GmbH, Munich (DE)

( * ) Notice: Subject to any disclaimer, the term of this patent is extended or adjusted under 35 U.S.C. 154(b) by 0 days.

(21) Appl. No.: 13/880,064

(22) PCT Filed: Oct. 24, 2011

(86) PCT No.: PCT/EP2011/068537
§ 371 (c)(1),
(2), (4) Date: Apr. 18, 2013

(87) PCT Pub. No.: WO2012/062561
PCT Pub. Date: May 18, 2012

(65) Prior Publication Data
US 2013/0207527 A1    Aug. 15, 2013

(30) Foreign Application Priority Data
Nov. 8, 2010    (DE) .......................... 10 2010 043 546

(51) Int. Cl.
*A47B 81/00*    (2006.01)
*H05K 5/02*    (2006.01)
(Continued)

(52) U.S. Cl.
CPC ............ *H05K 5/0239* (2013.01); *F25D 23/064* (2013.01); *F25D 23/067* (2013.01); *F25D 27/00* (2013.01); *F25D 29/005* (2013.01); *H05K 5/0004* (2013.01)

(58) Field of Classification Search
CPC ..... A47B 21/06; A47B 67/005; F25D 23/062
USPC ........ 312/223.5, 223.6, 400, 401; 16/2.1, 2.2; 174/152 G, 153 G; 362/94; 62/264
See application file for complete search history.

(56) References Cited

U.S. PATENT DOCUMENTS 5,448,809 A       9/1995  Kraus
5,537,714 A  *    7/1996  Lynch et al. ...................... 16/2.1
(Continued)

FOREIGN PATENT DOCUMENTS

CN            1259199          7/2000
CN            101836063        9/2010
(Continued)

OTHER PUBLICATIONS

International Search Report PCT/EP2011/068537 dated Jun. 27, 2012.

*Primary Examiner* — Matthew Ing
(74) *Attorney, Agent, or Firm* — Nixon & Vanderhye P.C.

(57) ABSTRACT

A backing piece for attaching an electrical component to a housing wall of an electrical household appliance and arrangement behind a matching opening in the housing wall includes a body having an essentially rectangular base surface, and a peripheral web configured as an elastic sealing lip for support against a rear face of the housing wall. Holding elements project from the body and form with the sealing lip a gap which receives a section of the housing wall at an edge of the opening. The holding elements are arranged in spaced-apart relationship about a periphery of the body such that at least one of the holding element is arranged on each of four sides of the rectangular base surface and one of the holding elements is provided at each of the corners of the body so as to apply a pressing force sufficient upon each section of the sealing lip.

24 Claims, 3 Drawing Sheets

(51) Int. Cl.
*H05K 5/00* (2006.01)
*F25D 23/06* (2006.01)
*F25D 27/00* (2006.01)
*F25D 29/00* (2006.01)

(56) References Cited

U.S. PATENT DOCUMENTS 6,150,622 A 11/2000 Malnati
2009/0056360 A1 3/2009 Kraus

FOREIGN PATENT DOCUMENTS

| | | |
|---|---|---|
| DE | 29606772 | 8/1996 |
| DE | 102006012922 | 9/2007 |
| DE | 102009000667 | 8/2010 |
| EP | 0615071 | 9/1994 |
| EP | 0892230 B1 | 10/2003 |
| FR | 2734086 A3 | 11/1996 |
| KR | 20020022302 | 3/2002 |
| RU | 2383830 | 3/2010 |
| WO | 2007107402 A1 | 9/2007 |
| WO | 2010089177 A2 | 8/2010 |

* cited by examiner

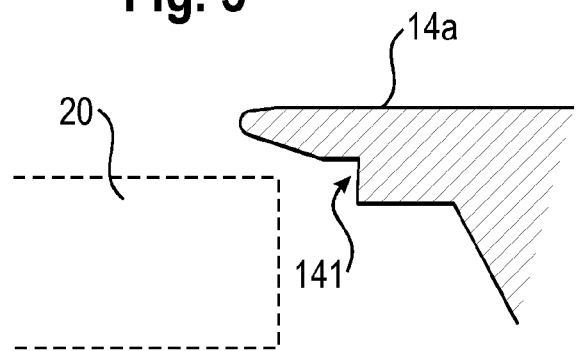
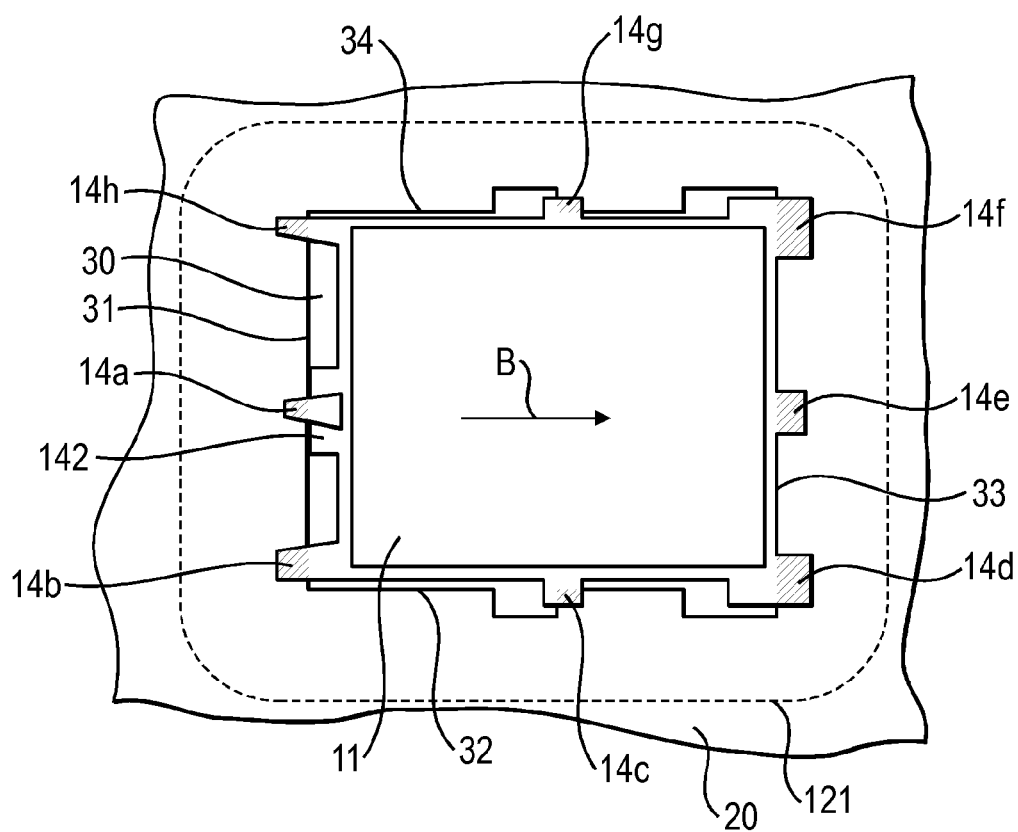

ered flat so that they do not project too far over the front face
BACKING PIECE FOR ATTACHING AN ELECTRICAL COMPONENT TO A HOUSING WALL This application is a U.S. National Phase of International Application No. PCT/EP2011/68537, filed Oct. 24, 2011, which designates the U.S. and claims priority to German Application No. 102010043546.5, filed Nov. 8, 2010, the entire contents of each are hereby incorporated by reference.

BACKGROUND OF THE INVENTION

The present invention relates to a backing piece for attaching an electrical component to the housing wall of an electrical household appliance.

A backing piece of the type in question serves in particular to attach an electrical component (e.g. a luminous element, temperature sensor or the like) to the inner wall or inner container wall of a refrigeration appliance. Such a backing piece is known for example from DE 10 2005 021 562 A1 (see rear wall 14 in FIG. 2). This backing piece is arranged behind a matching opening in the housing wall and is supported with an integrated peripheral web running around the opening against the rear face of the housing wall. The backing piece is attached and the seal is achieved by bonding the peripheral web. Such bonding is complex and an adequate and durable seal is frequently not achieved.

BRIEF SUMMARY OF THE INVENTION

The published patent application DE 10 2006 012 922 A1 shows an arrangement with a wall and a component anchored in an opening in the wall.

The published patent application EP 0 892 230 A1 shows a refrigeration appliance, with a luminous unit inserted into a recess in an inner wall of the refrigeration appliance.

The published patent application DE 10 2009 000 667 A1 shows a household refrigeration appliance with a receiving chamber in which a holding part for holding a temperature sensor, a luminous element and/or a thermostat is provided.

The utility model document DE 29 606 772 U1 shows an apparatus for the electrical connection of refrigeration appliance components.

The published patent application EP 0 615 071 A2 shows a holding element made of plastic.

One object of the invention is to provide a backing piece of the type mentioned in the introduction which can be attached simply and allows a reliable seal to be achieved.

This object is achieved by a backing piece with the features of claim 1. Preferred developments and embodiments are set out in the dependent claims. According to the independent claims the achievement of the object also extends to a lighting facility, a refrigeration appliance and a method for mounting the inventive backing piece on a housing wall. Preferred developments and embodiments of these will emerge in a similar manner.

To achieve the object a backing piece is proposed, which is designed to be arranged or attached behind a matching opening in the housing wall. The backing piece has a body and an (integrated) peripheral web running around the opening, with which it is supported against the rear face of the housing wall. Provision is made for this peripheral web to be configured as an elastic sealing lip, which is pressed in a sealing manner against the rear face of the housing wall. To this end the backing piece is provided with a plurality of holding elements, which project from the body and form a gap between themselves and the sealing lip, said gap being designed to receive a section of the housing wall at the edge of the opening. The holding elements preferably engage around and/or behind the edge of the opening in the housing wall from the rear. Provision is also made for said holding elements to be distributed in such a manner that a sufficient pressing force is introduced into each section of the sealing lip so that it is pressed reliably and durably all round against the rear face of the housing wall, when the backing piece is attached behind the matching opening in the housing wall.

The inventive backing piece can be attached without bonding, thereby reducing mounting outlay and costs. The holding elements are preferably configured and arranged so that a mounting tolerance is permitted in relation to the opening in the housing wall. The absence of bonding means that the inventive backing piece can also be removed more easily. Reliable attachment and a durable seal are also achieved in relation to the housing wall. In particular the achieved seal is foam-tight to allow back-foaming or foaming of the housing wall in the region of the backing piece without the foam material (in particular an insulating foam) penetrating through to the front face. The rear face of the housing wall can therefore also be referred to as the foam face.

Provision is preferably made for the entire backing piece, i.e. including the sealing lip and holding elements, to be made as a single piece from a cold-resistant plastic material. The backing piece is configured in particular as an injection molded piece.

Provision is also preferably made for the holding elements to be configured as planar and to extend roughly parallel to the sealing lip and/or parallel to the housing wall. The planar configuration also allows said holding elements to be configured flat so that they do not project too far over the front face of the housing wall, as would be the case for example with conventional latching elements. Provision can also be made for the holding elements to be configured as resilient, thereby facilitating for example the mounting of the backing piece, in particular for thicker housing walls.

The holding elements are preferably distributed around the periphery of the backing piece so that at least one holding element is arranged on each side of a rectangular backing piece. This ensures that a sufficient pressing force is introduced over the entire periphery of the sealing lip. Alternatively or additionally a holding element can be provided at each of the corners of the backing piece.

Provision can preferably also be made for at least one holding element also to be configured as a fixing element, which fixes the backing piece in an intended and in particular ideal position in relation to the opening in the housing wall. The fixing element prevents unwanted displacement of the backing piece. Provision is made in particular for said fixing element to be configured as a latching element, which has to be unlatched in order to be able to remove the backing piece.

This can be achieved for example in that the fixing element has a step on its side facing the sealing lip, providing a latching position for the edge of the opening. On insertion the fixing element can preferably engage around the edge of the opening in the housing wall beyond the step, while for fixing purposes the holding element is then withdrawn until its step rests against the edge of the opening.

Provision is further preferably made for the sealing lip to be configured as planar and in particular with a slight inclination (in relation to the housing wall). This slight inclination of the sealing lip allows reliable positioning of the sealing lip for different wall thicknesses of the housing wall, thereby ensuring durable sealing in relation to the housing wall. This is particularly relevant for the wall thickness tolerances, some of which can be large due to manufacturing tolerances, for the inner containers of a refrigeration appliance as they should not result in a loss of leaktightness. The projecting width of the sealing lip is ideally at least 15 mm, preferably at least 20 mm and in particular at least 25 mm According to one preferred development provision is made for the backing piece to have a body, from which the sealing lip projects all round. Provision is made in particular for the shortest side length of the body to be at least 30 mm, preferably at least 40 mm and in particular at least 50 mm. Despite such a relatively large body, the backing piece can be attached and sealed reliably.

In longer side sections the seal can be brought about by providing at least one holding element in such a side section, which introduces a pressing force into the sealing lip in this region.

To facilitate mounting and/or removal, at least one grip facility can be arranged on the body. A number of grip facilities are preferably provided, allowing the backing piece to be gripped easily with the hand. Provision is also preferably made for the body to be configured with ribbing, to increase its mechanical stability. According to one particularly preferred embodiment the body is configured with an integrated reflector section for reflecting and/or distributing the light from a light source. The body can also be configured with a connector piece for electrical contact with the light source or another electronic component.

The achieving of the abovementioned object further extends to a lighting facility, which has an inventive backing piece and an upper part that can be connected thereto. In particular it is an internal lighting facility for a refrigeration appliance, which is attached to an inner wall (inner container wall) of the cooled interior. Provision is preferably made for the upper part to be able to be connected in a releasable manner to the backing piece. Provision is made in particular for the upper part simply to be a light-permeable cover, while the light source and the associated contact, optionally also the controller, are housed in the backing piece.

The achieving of the abovementioned object also extends to a refrigeration appliance or an electrical household appliance, which has at least one inventive backing piece and/or at least one lighting facility as described above. In particular it is an electrical household appliance such as a refrigerator, a wine storage cabinet, a freezer or the like.

The achieving of the abovementioned object also extends to a method for mounting an inventive backing piece on the housing wall of an electrical household appliance, wherein the backing piece is inserted from the rear into a matching opening in the housing wall and then displaced in a counter movement direction in the plane of the housing wall, until all the holding elements of the backing piece engage around and/or behind the edge of the opening in the housing wall. This mounting method differs clearly from conventional insertion methods. It has the major advantage that mounting and/or removal can be undertaken easily and efficiently even when space is restricted. The backing piece is preferably inserted obliquely from the rear into a matching opening in the housing wall and pushed forward as far as possible until all the holding elements reach through the opening. The backing piece is then displaced in a counter movement direction in the plane of the housing wall, until all the holding elements on the front face of the housing wall rest against it to some degree at least or clamp a section of the housing wall between themselves and the sealing lip. The forward displacement direction of the backing piece is particularly preferably limited in said direction up to the latching position of a fixing element, e.g. until the edge of the opening latches with a step of the fixing element.

BRIEF DESCRIPTION OF THE DRAWINGS

Further features and advantages of the invention will emerge from the exemplary description of an exemplary embodiment which follows with reference to the accompanying figures, in which:

FIG. 3 shows a schematic view of an enlargement of a holding element;

FIG. 4 shows the contour of the opening in the housing wall, looking at the rear;

DETAILED DESCRIPTION OF EXEMPLARY EMBODIMENTS OF THE PRESENT INVENTION

The direction details used in the following relate to the illustrations shown in the figures.

Figure 1:
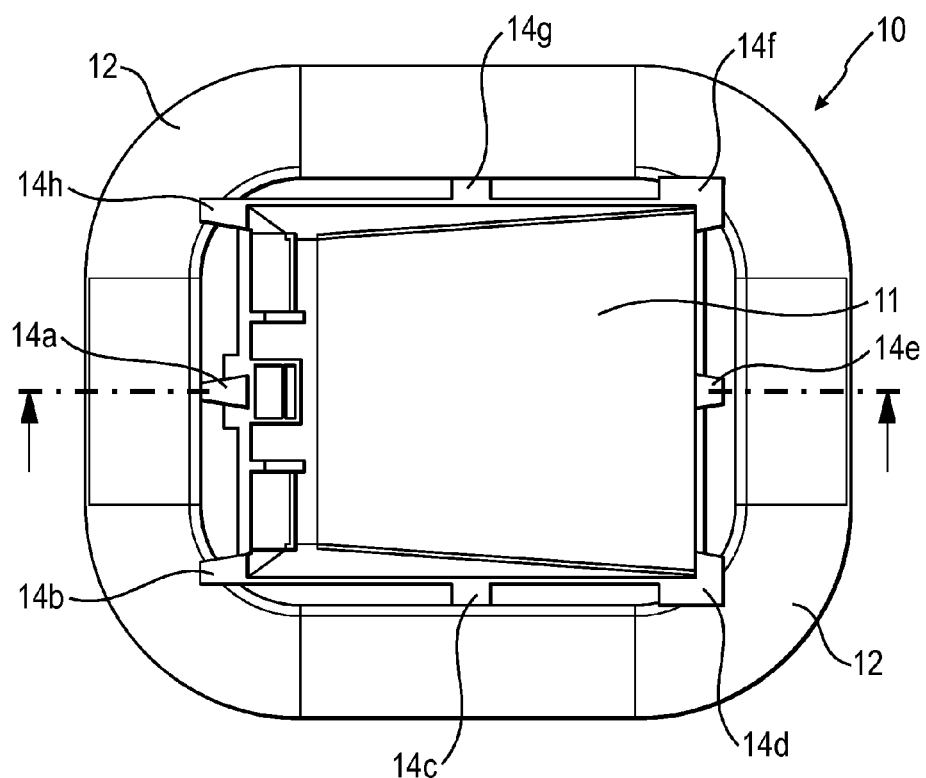
FIG. 1 shows the top view of an inventive backing piece.

FIG. 1 shows a backing piece designated as a whole as 10. The backing piece 10 has a body 11 that is rectangular when viewed from above with an elastic sealing lip 12 running around it. The top view illustrated clearly shows the extensive configuration of the sealing lip 12. The body 11 serves as a support for at least one electrical component.

The backing piece 10 is provided to be arranged behind a matching opening in a housing wall, with the body 11 being positioned essentially behind said opening and the sealing lip 12 resting around the opening on the rear face of the housing wall. For attachment purposes the body 11 of the backing piece 10 is configured with a total of eight tongue-type holding elements 14a to 14h around it, engaging around and/or behind the edge of the opening in the housing wall from the rear, as described in more detail below.

The distribution or arrangement of the holding elements 14a to 14h means that sufficient pressing force is introduced into each section of the sealing lip 12, so that it is pressed reliably and durably all round against the rear face of the housing wall. The holding elements 14b, 14d, 14f and 14h are located in the corner regions of the body 11. The holding elements 14a, 14c, 14e and 14g are located centrally in the side regions of the body 11. The left-side holding elements 14a, 14b and 14h are longer than the right-side holding elements 14d, 14e and 14f.

The extensive configuration of the sealing lip 12 allows optimum support and primarily also foam-tight sealing to be achieved on the rear face of the housing wall, thereby allowing back-foaming of the backing piece 10, during which process high pressures sometimes occur, without the introduced foam material penetrating through to the front face.

Figure 2:
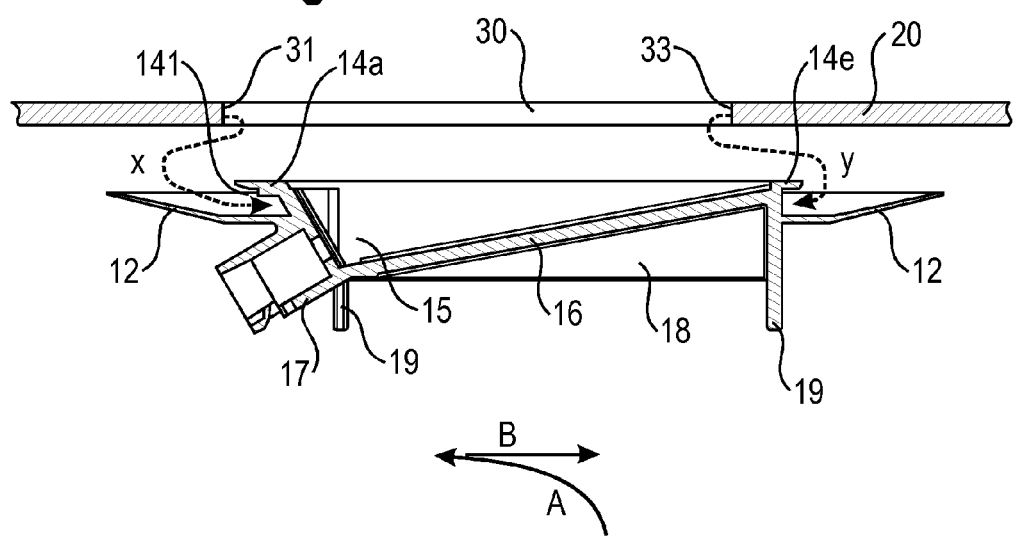
FIG. 2 shows a section through the backing piece from FIG. 1 according to the sectional profile indicated in FIG. 1.

FIG. 2 shows a sectional view of the backing piece 10. This diagram very clearly shows the thin-walled and planar configuration of the sealing lip 12 (e.g. the overall height of the sealing lip 12 is maximum 1.5 mm) The sealing lip 12 is configured with a slight inclination (approx. 5° to 15°) toward its outer edge. The wall thickness of the sealing lip 12 also decreases toward the outer edge. Both these things are advantageous in relation to the sealing effect. It can also be seen clearly in the diagram in FIG. 2 that the holding elements 14a and 14e are configured as planar and relatively flat and extend roughly parallel to the sealing lip 12, which is equally the case for all the holding elements.

The backing piece 10 shown in the figures is a light backing piece, which is configured to hold a light source in the region designated as 15. The backing piece 10 also has a reflector section 16 and a connector piece 17 for electrical contact. The rear face of the reflector section 16 is configured with reinforcing ribs 18. 19 designates grip facilities, which allow simple gripping of the backing piece 10 with the hand for the purposes of mounting or removal.

The mounting of the backing piece 10 on a housing wall 20 with a matching opening 30 (see also FIG. 3) configured therein is explained below with reference to FIG. 2. In the mounted state the left-side edge 31 of the opening 30 is located in a gap that is configured between the left holding element 14a and the sealing lip 12. The right-side edge 33 of the opening 30 is located in a gap between the right holding element 14e and the sealing lip 12. This is shown by the arrows x and y. The holding elements 14a and 14e (the same applies to the other holding elements) serve here in the manner of counter bearings for the sealing lip 12 that rests against the rear face of the housing wall 20, thereby causing the sealing lip 12 to be pressed against it, with the result that the sealing lip 12 changes shape elastically and is for its part supported by elastic return forces against the rear face of the housing wall 20.

For mounting purposes the backing piece 10 is first inserted slightly obliquely from the rear into the opening 30, until the left holding element 14a engages completely over or around the left-side edge 31 of the opening 30 and the left-side edge 31 comes up against the inner arch between the holding element 14a and the sealing lip 12. This insertion movement is shown by the arrow A. The relative movement between the backing piece 10 and the housing wall 20 here is several millimeters (e.g. 4 to 8 mm, preferably around 6 mm) The backing piece 10 is then displaced in the counter direction in the plane of the housing wall 20, until the right holding element 14e engages over or around the right-side edge 33 of the opening 30 and the right-side edge 33 comes up against the inner arch between the holding element 14e and the sealing lip 12. This displacement movement is shown by the arrow B. It may be necessary during this displacement movement B to press the backing piece 10 against the rear face of the housing wall 20 counter to the elastic spring action of the sealing lip 12.

The displacement movement B is only a few millimeters (e.g. 2 to 4 mm, preferably around 3 mm, in any case smaller than the relative movement A). During the displacement movement B the longer left holding element 14a slides back to the right in relation to the left-side edge 31 of the opening 30, until the holding element 14a can be deflected in the direction of the sealing lip 12 and the latching edge 141 configured on the holding element 14a rests against the left-side edge 31 of the opening 30. FIG. 3 shows an enlarged diagram of the left holding element 14a with the integrated latching edge 141. This fixes the backing piece 10 in an intended position in relation to the opening 30 in the housing wall 20, which is also particularly expedient in respect of later back-foaming. To release this fixing for removal, a pressure force has to be applied manually to the connector piece 17 and/or to the left grip facility 19. The application of such a pressure force can in some instances also facilitate the mounting of the backing piece 10.

FIG. 4 shows a top view of the contour of the opening 30 in the housing wall 20, looking at the front. The edges of the opening 30 are shown as 31 to 34. The backing piece 11 is inserted and latched behind the opening. The hatched areas show the regions in the housing wall, behind which the holding elements 14a to 14h engage after the displacement of the backing piece 10 in direction B, which produces an approximately even pressure of the sealing lip 12 against the rear face of the housing wall 20 due to the distribution. The holding element 14a also functions as a fixing element, therefore it has a longer tongue and a shorter planar region 142, between which the step 141 is configured. In the illustrated latched state the outer edge of the shorter region 142 rests against the edge 31 of the opening 30 in the housing wall 20.

The external outline of the sealing lip 12 resting against the rear face is shown broken and marked 121. The relatively large overlap region with the outer edges 31 to 34 of the opening 30 is clearly shown. The contour of the opening 30 is configured in the same way as the backing piece 10. By way of example it is an approximately rectangular shape. However when corresponding backing pieces are used, the contour of the opening 30 can also be square, oval, circular or any other shape.

Figure 5:
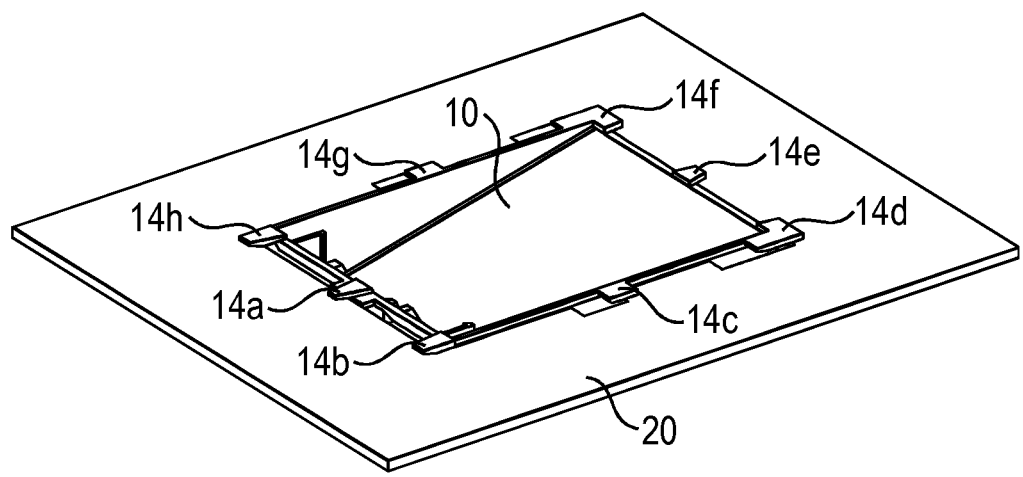
FIG. 5 shows a perspective view of the backing piece from FIG. 1 attached to a housing wall, looking at the front.

FIG. 5 shows the backing piece 10 mounted on a housing wall 20 looking at the front. An upper part, in particular a light-permeable cover, can now be attached to the backing piece 10 from the front. The holding elements 14a to 14h are arranged both in the corner regions and in the side regions in between. The provision of the holding elements in the side regions also allows a sufficient pressing force to be applied in the corresponding sections of the sealing lip 12. With backing pieces of large dimensions in particular it is possible also to provide a number of holding elements in such side regions.

Figure 6:
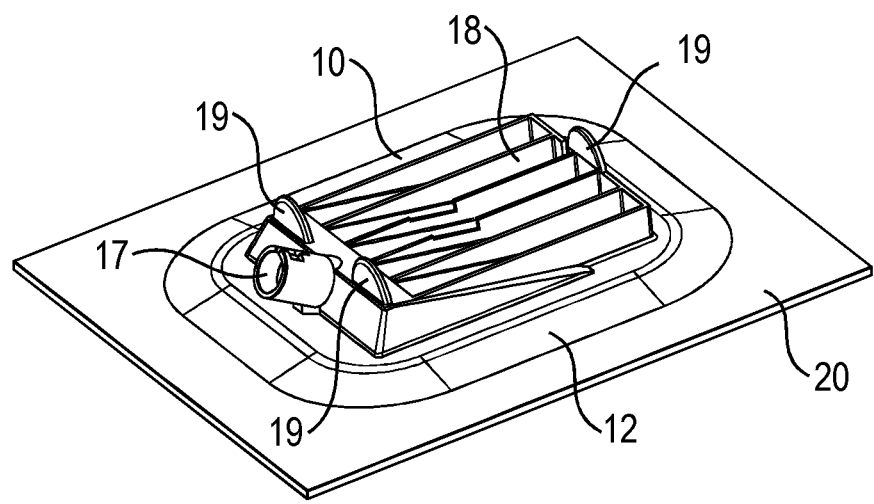
FIG. 6 shows a perspective view of the backing piece from FIG. 1 attached to a housing wall, looking at the rear.

FIG. 6 shows the backing piece 10 mounted on the housing wall 20 looking at the rear. As shown in the illustrated diagram, the entire sealing lip 12 rests flat against the rear face of the housing wall 20 running around the invisible opening 30, thereby extending essentially parallel to the housing wall 20.

The invention claimed is:

1. A backing piece for attaching an electrical component to a housing wall of an electrical household appliance and arrangement behind an opening in the housing wall, said backing piece comprising:
    a body having an essentially rectangular base surface defined by four sides and corners between the sides;
    a peripheral web configured as an elastic sealing lip for support against a rear face of the housing wall; and
    a plurality of holding elements projecting from the body and forming with the sealing lip a gap there between, said gap being configured to receive a section of the housing wall at an edge of the opening, said holding elements being arranged in spaced-apart relationship about a periphery of the body such that at least one of the holding element is arranged on each of the four sides of the rectangular base surface and one of the holding elements is provided at each of the corners of the body so as to apply a pressing force sufficient upon each section of the sealing lip, when the backing piece is attached behind the opening in the housing wall.

2. The backing piece of claim 1, constructed for attaching the electrical component to an inner wall of the electrical household appliance.

3. The backing piece of claim 1, wherein the holding elements are configured as planar and extend roughly parallel to the sealing lip.

4. The backing piece of claim 1, wherein at least one of the holding elements is configured as a fixing element to fix the backing piece in an intended position in relation to the opening in the housing wall.

5. The backing piece of claim 4, wherein the fixing element has a step on its side facing the sealing lip to define a latching position for the edge of the opening.

6. The backing piece of claim 1, wherein the sealing lip is configured as planar and with a slight inclination.

7. The backing piece of claim 1, wherein the body is configured with an integrated reflector section.

8. The backing piece of claim 1, wherein the gap faces away from a central region of the rectangular base at each of the plurality of holding elements.

9. A lighting facility for an electrical household appliance, said lighting facility comprising:
- a backing piece for attaching an electrical component to a housing wall of the electrical household appliance and arrangement behind an opening in the housing wall, said backing piece including a body having an essentially rectangular base surface defined by four sides and corners between the sides, a peripheral web configured as an elastic sealing lip for support against a rear face of the housing wall, and a plurality of holding elements projecting from the body and forming with the sealing lip a gap there between, said gap being configured to receive a section of the housing wall at an edge of the opening in the housing wall, said holding elements being arranged in spaced-apart relationship about a periphery of the body such that at least one of the holding elements is arranged on each of the four sides of the rectangular base surface and one of the holding elements is provided at each of the corners of the body so as to apply a pressing force sufficient upon each section of the sealing lip, when the backing piece is attached behind the opening in the housing wall; and
- an upper part configured for connection to the backing piece.

10. The lighting facility of claim 9, constructed for a refrigeration appliance.

11. The lighting facility of claim 9, wherein the holding elements are configured as planar and extend roughly parallel to the sealing lip.

12. The lighting facility of claim 9, wherein at least one of the holding elements is configured as a fixing element to fix the backing piece in an intended position in relation to the opening in the housing wall.

13. The lighting facility of claim 12, wherein the fixing element has a step on its side facing the sealing lip to define a latching position for the edge of the opening.

14. The lighting facility of claim 9, wherein the sealing lip is configured as planar and with a slight inclination.

15. The lighting facility of claim 9, wherein the body is configured with an integrated reflector section.

16. An electrical household appliance, comprising:
a housing wall having an opening; and
at least one backing piece for attaching an electrical component to the housing wall and arrangement behind the opening in the housing wall, said backing piece including a body having an essentially rectangular base surface defined by four sides and corners between the sides, a peripheral web configured as an elastic sealing lip for support against a rear face of the housing wall, and a plurality of holding elements projecting from the body and forming with the sealing lip a gap there between, said gap being configured to receive a section of the housing wall at an edge of the opening, said holding elements being arranged in spaced-apart relationship about a periphery of the body such that at least one of the holding element is arranged on each of the four sides of the rectangular base surface and one of the holding elements is provided at each of the corners of the body so as to apply a pressing force sufficient upon each section of the sealing lip, when the backing piece is attached behind the opening in the housing wall.

17. The electrical household appliance of claim 16, constructed in the form of a household refrigeration appliance.

18. The electrical household appliance of claim 16, further comprising a lighting facility, said backing piece being part of the lighting facility.

19. The electrical household appliance of claim 16, wherein the holding elements are configured as planar and extend roughly parallel to the sealing lip.

20. The electrical household appliance of claim 16, wherein at least one of the holding elements is configured as a fixing element to fix the backing piece in an intended position in relation to the opening in the housing wall.

21. The electrical household appliance of claim 20, wherein the fixing element has a step on its side facing the sealing lip to define a latching position for the edge of the opening.

22. The electrical household appliance of claim 16, wherein the sealing lip is configured as planar and with a slight inclination.

23. The electrical household appliance of claim 16, wherein the body is configured with an integrated reflector section.

24. A method for mounting a backing piece on a housing wall of an electrical household appliance, comprising:
- inserting the backing piece from the rear into an opening in the housing wall; and
- displacing the backing piece in a counter movement direction in a plane of the housing wall, until all holding elements of the backing piece engage around or behind an edge of the opening in the housing wall.

* * * * *